US012435421B2

(12) United States Patent
Jeong et al.

(10) Patent No.: US 12,435,421 B2
(45) Date of Patent: Oct. 7, 2025

(54) APPARATUS AND METHOD FOR FORMING THIN FILM

(71) Applicant: AP SYSTEMS INC., Hwaseong-Si (KR)

(72) Inventors: Pil Seong Jeong, Yongin-si (KR); Sang Hyun Ji, Yongin-si (KR); Chang Kyo Kim, Hwaseong-si (KR); Dong Sik Kim, Suwon-si (KR)

(73) Assignee: AP SYSTEMS INC. (KR)

( * ) Notice: Subject to any disclaimer, the term of this patent is extended or adjusted under 35 U.S.C. 154(b) by 53 days.

(21) Appl. No.: 18/029,898

(22) PCT Filed: Sep. 16, 2021

(86) PCT No.: PCT/KR2021/012747

§ 371 (c)(1),
(2) Date: Mar. 31, 2023

(87) PCT Pub. No.: WO2022/080688

PCT Pub. Date: Apr. 21, 2022

(65) Prior Publication Data

US 2023/0366092 A1 Nov. 16, 2023

(30) Foreign Application Priority Data

Oct. 13, 2020 (KR) ........................ 10-2020-0131975

(51) Int. Cl.
*C23C 16/50* (2006.01)
*C23C 16/455* (2006.01)
(Continued)

(52) U.S. Cl.
CPC ........ *C23C 16/50* (2013.01); *C23C 16/45559* (2013.01); *C23C 16/52* (2013.01); *H01J 37/32* (2013.01); *H01J 37/32229* (2013.01)

(58) Field of Classification Search
CPC ... C23C 16/50; C23C 16/45559; C23C 16/52; C23C 16/4412; C23C 16/481;
(Continued)

(56) References Cited

U.S. PATENT DOCUMENTS 5,653,808 A * 8/1997 MacLeish ........... C23C 16/4584 118/725
6,113,984 A * 9/2000 MacLeish ............... C30B 25/10 118/725
(Continued)

FOREIGN PATENT DOCUMENTS

CN 107403717 A 11/2017
CN 107523860 A 12/2017
(Continued)

OTHER PUBLICATIONS

International Search Report for PCT/KR2021/012747, mailed Dec. 27, 2021.

*Primary Examiner* — Jeffrie R Lund
(74) *Attorney, Agent, or Firm* — Renaissance IP Law Group LLP

(57) ABSTRACT

Provided are an apparatus and method for forming a thin film. The apparatus for forming a thin film include a chamber configured to define a substrate processing space therein, a substrate support part connected to the chamber to support a substrate inside the chamber, a heat source part connected to the chamber to face the substrate support part, and a plasma generation part connected to the chamber to supply radicals between the substrate support part and the heat source part at at least two points.

16 Claims, 3 Drawing Sheets

(51) Int. Cl.
*C23C 16/52* (2006.01)
*H01J 37/32* (2006.01)

(58) Field of Classification Search
CPC ...... C23C 16/482; C23C 16/452; H01J 37/32; H01J 37/32229
See application file for complete search history.

(56) References Cited

U.S. PATENT DOCUMENTS

| | | | | |
|---|---|---|---|---|
| 6,450,116 | B1 | 9/2002 | Noble et al. | |
| 11,414,759 | B2 * | 8/2022 | Lin | C30B 25/14 |
| 11,732,355 | B2 * | 8/2023 | Pandey | H01J 37/3244 118/723 R |
| 11,959,169 | B2 * | 4/2024 | Shono | H01L 21/67017 |
| 2006/0275546 | A1 * | 12/2006 | Arena | C23C 16/45508 156/345.33 |
| 2009/0214798 | A1 | 8/2009 | Yousif et al. | |
| 2012/0031559 | A1 | 2/2012 | Dhindsa et al. | |
| 2015/0152991 | A1 * | 6/2015 | Lin | C30B 25/14 137/334 |
| 2017/0314126 | A1 * | 11/2017 | Tjandra | C23C 16/4584 |
| 2023/0133402 | A1 * | 5/2023 | Olsen | C23C 16/45563 118/730 |
| 2023/0366092 | A1 * | 11/2023 | Jeong | C23C 16/4412 |
| 2023/0407471 | A1 * | 12/2023 | Pandey | H01J 37/3244 |

FOREIGN PATENT DOCUMENTS

| | | | | | |
|---|---|---|---|---|---|
| JP | 62235728 | A | * | 10/1987 | |
| JP | H04289172 | A | | 10/1992 | |
| JP | H08165563 | A | | 6/1996 | |
| JP | 2001284340 | A | | 10/2001 | |
| JP | 2013019053 | A | * | 1/2013 | C23C 16/45542 |
| KR | 20010110795 | A | | 12/2001 | |
| KR | 20030086951 | A | | 11/2003 | |
| KR | 20070099853 | A | | 10/2007 | |
| KR | 100775593 | B1 | | 11/2007 | |
| KR | 100798351 | B1 | | 1/2008 | |
| KR | 20080114427 | A | | 12/2008 | |

* cited by examiner

140 : 142, 144
150 : 152a, 152b, 154
410 : 412, 414
420 : 422, 424

140 : 142, 144
150 : 152a, 152b, 154
410 : 412, 414
420 : 422, 424

140 : 142, 144
150 : 152a, 152b, 154
420 : 420a, 420c, 420b

APPARATUS AND METHOD FOR FORMING THIN FILM

TECHNICAL FIELD

The present disclosure relates to an apparatus and method for forming a thin film, and more particularly, to an apparatus and method for forming a thin film, which are capable of improving uniformity of the thin film.

BACKGROUND ART

Recently, a rapid thermal processing (RTP) method is widely used as a method of thermally processing a substrate or the like.

The rapid thermal processing method is a method for irradiating radiation emitted from a heat source such as a tungsten lamp onto a substrate to thermally process the substrate. When compared to existing method for thermally processing a substrate using a furnace, such a rapid thermal processing method has an advantage of improving thermal processing quality of a substrate because the substrate is quickly heated and cooled, and pressure conditions or temperature bands are easily controlled.

An apparatus for forming a thin film using the rapid thermal processing method includes a chamber providing a space in which the substrate is mainly processed, a substrate support disposed inside the chamber to support the substrate, and a plasma generator that activates the heat source irradiating the radiation onto the substrate support and a process gas to supply the heat source and the process gas into the chamber. Here, the heat source and the substrate support are installed on upper and lower portions of the chamber, respectively, and, in the chamber, a (vertical) distance between the substrate and the heat source is short to efficiently heat the substrate, and a long and wide processing space is formed in a horizontal direction. Thus, since it is difficult to install the plasma generator inside the chamber, radicals are generated using the plasma generator outside the chamber during the forming of the thin film, and then the radicals are supplied through a sidewall of the chamber.

However, since the processing space inside the chamber is formed to be long and wide in the horizontal direction, there is a limitation in that the radicals are not sufficiently diffused throughout the processing space to deteriorate uniformity of the thin film.

In order to solve this limitation, a method for locally adjusting a temperature of the substrate using the heat source is used. However, in this case, there is a limitation in that the substrate is deformed by thermal stress due to a temperature deviation, and productivity is deteriorated.

(Prior Art Document 1) Korean Patent Registration No. 10-0775593

(Prior Art Document 2) Korea Patent Publication No. 10-2008-0114427

DISCLOSURE

Technical Problem

The present invention provides an apparatus and method for forming a thin film, which are capable of improving uniformity of the thin film.

Technical Solution

An apparatus for forming a film according to an embodiment of the present invention includes: a chamber configured to define a substrate processing space therein; a substrate support part connected to the chamber to support a substrate inside the chamber; a heat source part connected to the chamber to face the substrate support part; and a plasma generation part connected to the chamber to supply radicals between the substrate support part and the heat source part at at least two points.

The chamber may be provided in a hollow shape having a width, a thickness, and a height, and the processing space is defined to have a height less than each of a width and a thickness thereof, and the apparatus may include at least two injection ports passing through the chamber in a width or thickness direction of the chamber and an exhaust port passing through the chamber to face the at least two injection port.

The at least two injection ports may be disposed at the same height in the height direction of the chamber.

The at least two injection ports may be disposed parallel to each other, or at least one of the at least two injection ports is disposed to be inclined in a horizontal direction.

The substrate support part may include a substrate support that is rotatable and installed inside the chamber, and a spaced distance of the injection portions may be less than a radius of the substrate support.

The apparatus may further include a guide member disposed inside the chamber to define a passage communicating with each of the at least two injection ports.

The exhaust port may include: first exhaust ports having a spaced distance greater than a diameter of the substrate support part; and a second exhaust port disposed between the first exhaust ports.

The plasma generation part may include: a plurality of plasma generators configured to generate radicals; and at least two waveguides configured to connect the plurality of plasma generators to the at least two injection ports, respectively.

The plasma generation part may include: a plasma generator configured to generate radicals; and a waveguide configured to connect the plasma generator to the at least two injection ports, wherein the waveguide may include at least two branch tubes configured to connect the plasma generator to the at least two injection ports.

The plasma generation part may include a flow regulation member installed in the waveguide.

The plasma generation part may include a heating member installed on the waveguide.

A method for forming a thin film according to an embodiment of the present invention includes: loading a substrate into a chamber; heating the substrate; generating radicals; supplying the radicals to one side of the substrate in a direction parallel to the substrate through at least two paths; allowing the radicals to be in contact with the substrate so as to form a thin film; and exhausting residual radicals to the other side of the substrate.

The supplying of the radicals may include supplying the radicals at the same height in a direction in which the substrate extends.

The supplying of the radicals may include supplying the radicals through a first path comprising a central portion of the substrate from one side to the other side of the chamber and a second path comprising an edge of the substrate.

The supplying of the radicals may include: generating the radicals outside the chamber; and transferring the radicals to the chamber, wherein the transferring of the radicals may include adjusting a temperature of the radicals.

The supplying of the radicals may include regulating a flow rate of the radicals supplied to each of at least two paths.

The exhausting of the residual radicals may include adjusting at least one of a position, at which the residual radicals are exhausted, or an amount of radicals to be exhausted.

Advantageous Effects

According to the apparatus and method for forming the thin film according to the embodiments of the present invention, the uniformity of the thin film may be improved. That is, the radicals for forming the thin film may be in uniform contact with the substrate to uniformly form the thin film on the entire substrate. In addition, in the process of forming the thin film, the deformation of the substrate due to the thermal stress may be minimized. Therefore, the process yield may be improved, and the productivity may be improved.

DETAILED DESCRIPTION

Figure 1:
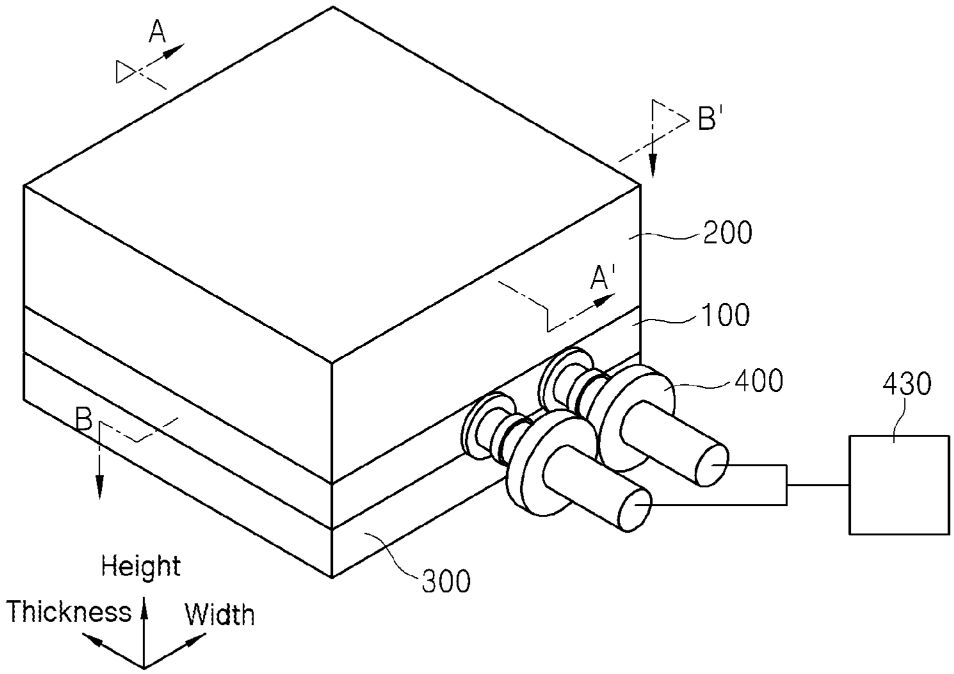
FIG. 1 is a perspective view illustrating an apparatus for forming a thin film according to an embodiment of the present invention.

Hereinafter, embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art. In the figures, like reference numerals refer to like elements throughout.

Figure 2:
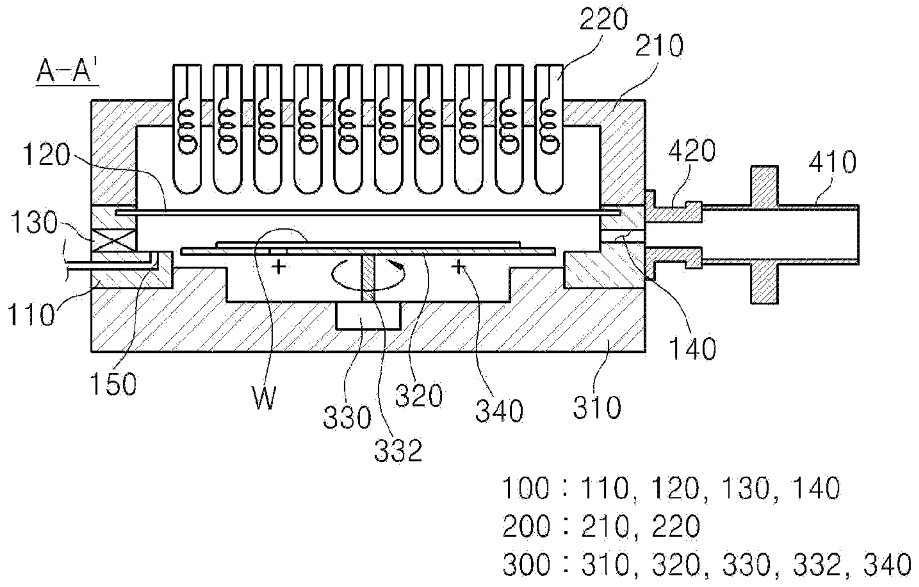
FIG. 2 is a cross-sectional view illustrating the apparatus for forming the thin film, which is taken along line A-A' in FIG. 1.
Figure 3:
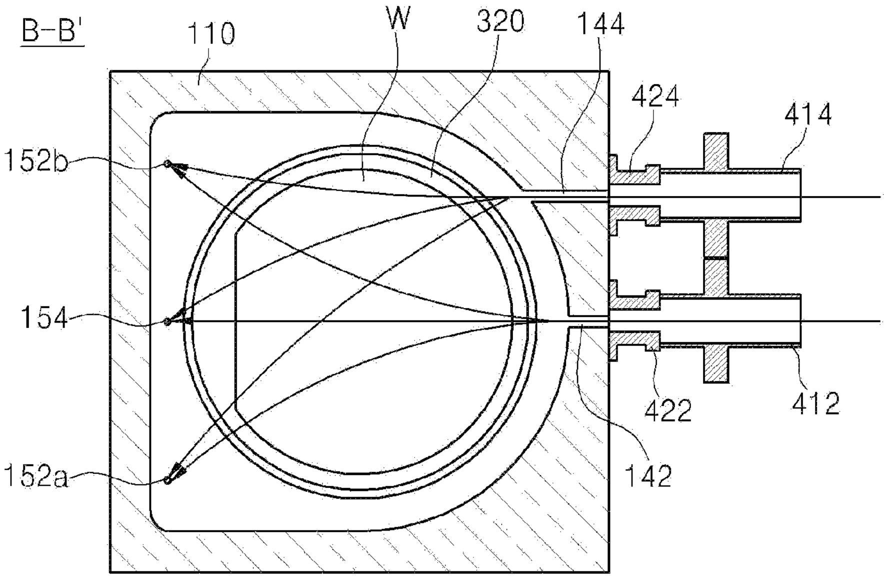
FIG. 3 is a cross-sectional view illustrating the apparatus for forming the thin film, which is taken along line B-B' in FIG. 1.

FIG. 1 is a perspective view illustrating an apparatus for forming a thin film according to an embodiment of the present invention, FIG. 2 is a cross-sectional view illustrating the apparatus for forming the thin film, which is taken along line A-A' in FIG. 1, and FIG. 3 is a cross-sectional view illustrating the apparatus for forming the thin film, which is taken along line B-B' in FIG. 1.

Referring to FIGS. 1 to 3, an apparatus for forming a thin film according to an embodiment of the present invention may include a chamber 100 having a space in which a substrate W is processed therein, a substrate support part 300 connected to the chamber 100 to support the substrate W inside the chamber 100, a heat source part 200 connected to the chamber 100 to face the substrate support part 300, and a plasma generation part 400 that supplies radicals between the substrate support part 300 and the heat source part 200 at at least two points. Here, the heat source part 200 may be installed on an upper portion of the chamber 100, and the substrate support part 300 may be installed on a lower portion of the chamber 100. Here, the apparatus for forming the thin film may include a rapid thermal processing (RTP) device that irradiates radiation emitted from a heat source onto the substrate to heat the substrate.

Hereinafter, a direction in which radicals are moves, i.e., a direction in which the radicals are injected into the chamber and then discharged is referred to as a thickness direction, and a direction horizontally crossing the thickness direction is referred to a width direction with respect to the chamber 100. Also, a vertical direction of the chamber 100 is referred to as a height direction.

The chamber 100 may include a chamber body 110 having a substantially rectangular frame shape with opened upper and lower portions and a transmission window 120 connected to the upper portion of the chamber body 110.

The chamber body 110 may be integrally manufactured as a single body, but may also have an assembly body in which several components are connected to be coupled to each other. In this case, a sealing part (not shown) may be additionally provided on the connection portion between the components. Thus, when heating or cooling the substrate W, energy input into the apparatus may be reduced. A gate 130 through which the substrate W is loaded or unloaded may be provided in the chamber body 110. In addition, the chamber body 110 may include an injection port 140 (142 and 144) through which the radicals for forming the thin film are injected and an exhaust port 150 through which a gas inside the chamber 100 is discharged, and residual radicals remaining after forming the thin film are exhausted. Here, the gate 130, the injection port 140, and the exhaust port 150 may be provided in the width direction of the chamber body 110, and the injection port 140 and the exhaust port 150 may be provided to face each other.

The transmission window 120 may be connected to the upper portion of the chamber body 110 to seal the inside of the chamber body 110. The transmission window 120 may transmit the radiation emitted from the heat source of the heat source part 200 installed on the upper portion the chamber 100 and may be made of a transparent material such as quartz or sapphire that is capable of withstanding a high temperature.

The chamber 100 may be provided in a hollow shape having a width, thickness, and a height so as to define the processing space capable of processing the substrate W therein. Here, the chamber 100 is provided to have a height less than each of the width and thickness and may define the processing space that is longer and wider in the horizontal direction than in the vertical direction.

At least two injection ports 140 may be provided in the chamber body 110. Two or more injection ports 140 may be provided. However, an example in which two injection ports 140 are provided in the chamber body 110 will be described here. The two injection ports 140 may be provided to be spaced apart from each other at the same height in the height direction of the chamber body 110. Here, the two injection ports 140 may be provided to be disposed at a position higher than that of at least the substrate support 320. The two injection ports 140 may be provided to have a spaced distance less than a radius of the substrate W or the substrate support 320. For example, one injection port 142 of the two injection ports 140 may be provided to supply the radicals toward a center of the substrate W or the substrate support 320, and the other injection port 144 may be provided to supply the radicals toward an edge of the substrate W or the substrate support 320. If the spaced distance between the injection ports 140 is too long, it is difficult to uniformly supply the radicals into the chamber 100, and thus, the uniformity of the thin film disposed on the substrate W may be deteriorated. On the other hand, if the spaced distance between the injection ports 140 is short, the radicals may be more uniformly supplied onto the chamber 100 to improve the uniformity of the thin film disposed on the substrate W. However, here, there is difficulty in connecting a waveguide 420 of the plasma generation part 400.

The two injection ports 140 may be disposed parallel to each other. Alternatively, at least one of the two injection ports 140 may be inclined in the horizontal direction. For example, one of the two injection ports 140 may be disposed toward the center of the substrate support 320, and the other may be disposed to be inclined toward the outside of the substrate support 320 from the edge of the substrate support 320. Thus, since the radicals are diffused in the wider area inside the chamber 100, the substrate W may be in sufficient contact with the radicals to further improve the uniformity.

Figure 4:
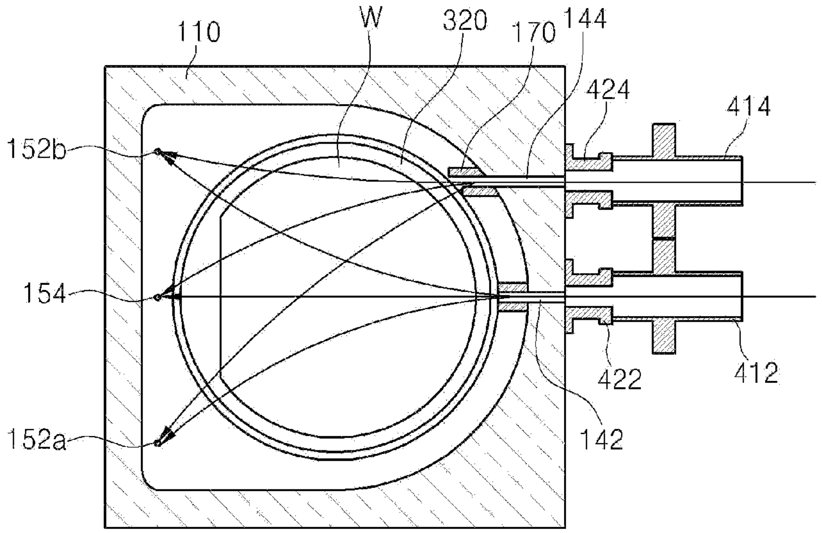
FIG. 4 is a view illustrating a state in which a guide member is installed in a chamber.

FIG. 4 is a view illustrating a state in which a guide member is installed in the chamber.

Referring to FIG. 4, a guide member 170 for guiding the movement direction of the radicals may be disposed inside the chamber 100. The guide member 170 may be disposed between the substrate support 320 and the injection port 140 to extend along a direction in which the injection port 140 extends. The guide member 170 may guide the radicals to move in a target direction by providing a passage communicating with the injection port 140. Through this, the uniformity of the thin film disposed on the substrate W may be more precisely controlled. The guide member 170 may be provided in the form of a partition wall extending vertically on both sides of the injection port 140 or may be provided in the form of a pipe inserted into the injection port 140. Here, when the guide member 170 is provided in the form of the partition wall, the guide member 170 may be provided to completely block a gap between the injection ports 140 (142 and 144) or may be provided to partially block a portion between the injection ports 140 (142 and 144). That is, the passage provided by the guide member 170 may be provided in a tubular shape or may be provided in a concave groove shape. Hereinafter, an example in which the passage is provided in the tubular shape having an inner diameter will be described.

The guide member 170 may provide a passage having the same inner diameter as an inner diameter of the injection port 140 or may provide a passage having an inner diameter that gradually increases toward the substrate support 320. Alternatively, the guide member 170 may provide a passage having a diameter greater than a diameter of the injection port 140 or may provide a passage having a diameter less than a diameter of the injection port 140. Alternatively, the passages provided by the guide member 170 may be provided to have different diameters. For example, the passage communicating with the injection port 142 through which the radicals are supplied toward the center of the substrate support 320 may be provided to have a diameter greater than that of the passage communicating with the injection port 144 through which the radicals are supplied toward the edge of the substrate support 320. Alternatively, the passage communicating with the injection port 142 through which the radicals are supplied toward the center of the substrate support 320 may be provided to have a diameter less than that of the passage communicating with the injection port 144 through which the radicals are supplied toward the edge of the substrate support 320.

Here, the two injection ports 142 and 144 are provided in the chamber body 110, and the guide member 17 is provided inside the chamber body 110 to guide the movement direction of the radicals. However, a slit-shaped injection port may be provided in the chamber body, and two waveguides may be connected to the injection port. In addition, the guide member may be provided inside the chamber body to guide the movement direction of the radicals injected into each of the waveguides. In this case, the guide member may be provided in a shape of which a width increases toward the substrate support 320 so that the radicals are sufficiently diffused over the entire substrate W.

The exhaust port 150 may be provided to pass through the chamber body 110 at a side facing the injection port 140. Here, the exhaust port 150 may be provided to face the injection port 140 so that the radicals uniformly flow while being in contact with a surface of the substrate W inside the chamber 100. The exhaust port 150 may be connected to an exhaust line (not shown), in which a pump (not shown) is installed, to discharge the gas and radicals inside the chamber 100 and also perform pressure control such as forming of a vacuum state inside the chamber 100. The exhaust port 150 may include at least one of a pair of first exhaust ports 152*a* and 152*b* provided to have a spaced distance greater than the diameter of the substrate support 320 or one second exhaust port 154 provided between the first exhaust ports 152*a* and 152*b*. For example, only the first exhaust ports 152*a* and 152*b* or only the second exhaust port 154 may be provided in the chamber 100. Alternatively, both the first exhaust ports 152*a* and 152*b* and the second exhaust port 154 may be provided in the chamber 100. In this case, since the radicals injected into the chamber 100 are more uniformly diffused throughout the inside of the chamber 100 so as to be in uniform contact over the entire substrate W, the uniformity of the thin film disposed on the substrate W may be further improved.

The first exhaust ports 152*a* and 152*b* and the second exhaust port 154 may be connected to exhaust lines different from each other, respectively. In this case, an exhaust amount adjusting member (not shown) capable of adjusting an exhaust amount is installed in each of the exhaust lines to adjust an amount of radicals or gases discharged through each of the first exhaust ports 152*a* and 152*b* and the second exhaust port 154.

The heat source part 200 is installed on the upper portion of the chamber 100 to heat the substrate W loaded into the chamber 100. The heat source part 200 may include a hollow support body 210 with an opened lower portion and a heat source 220 installed inside the support body 210.

The support body 210 may be provided to have an area similar to that of the chamber 100 or a process space inside the chamber 100, and a lower portion of the support body 210 may be opened to allow radiation emitted from the heat source 220 to proceed toward the chamber 100. Here, an uneven structure (not shown) such as a recessed groove may be provided on the support body 210, or a reflective film (not shown) may be disposed on the support body 210 to reflect the radiation emitted from the heat source 220 toward the chamber 100. The support body 210 may include a passage (not shown) through which a cooling medium or the like is circulated to prevent overheating due to the radiation emitted from the heat source 220.

The heat source 220 may include a lamp capable of emitting radiation, such as a tungsten halogen lamp, a carbon lamp, and a ruby lamp and may be provided in various shapes such as a linear shape or a bulb shape.

The substrate support part 300 may be installed on the lower portion of the chamber 100 to face the heat source part 200. The substrate support part 300 may include a substrate support 320 capable of supporting the substrate W thereon, and a driver 330 for rotating the substrate support 320. In addition, the substrate support part 300 may further include a lift member 340 for vertically moving the substrate W, a temperature measuring device (not shown) for measuring the temperature of the substrate W, and the like. The substrate support part 300 may include a separate housing 310 and be coupled to the lower portion of the chamber 100 to seal the inside of the chamber 100.

The substrate support 320 may include an electrostatic chuck to adsorb and maintain the substrate 110 by using electrostatic force so that the substrate W is seated and supported. Alternatively, the substrate support 200 may support the substrate W through vacuum adsorption or mechanical force. The substrate support 320 may be provided in a shape corresponding to the shape of the substrate W, for example, a circular shape and may be manufactured to be larger than the substrate W.

The driver 330 may be connected to a lower portion of the substrate support 320 through a rotation shaft 332 and may rotate the substrate W when forming the thin film on the substrate W.

The plasma generation part 400 includes a process gas supplier 430, a plasma generator 410 that receives power from the outside to generate plasma and activates a process gas supplied from the process gas supplier 430 to generate radicals, and a waveguide 420 connecting the plasma generator 410 to the chamber to supply the radicals into the chamber 100. Here, the plasma generation part 400 may include two plasma generators 410 and two waveguides 420 to supply the radicals to each of the two injection ports 140. In addition, the plasma generation part 400 may include a flow regulator (not shown) provided in at least one of the two waveguides 420 so as to regulate a flow rate of the radicals supplied to each injection port 140.

The plasma generation part 400 may include a heating member (not shown) for adjusting a temperature of the waveguide 420 so as to maintain a constant temperature of the radicals supplied from the plasma generator 410 to the chamber 100. That is, the radicals generated by the plasma generator 410 may move along the waveguide 420 and be supplied into the chamber 100. In this case, when the temperature of the radicals in the waveguide 420 is lowered, there is a limitation in that the radicals are converted into a gaseous state due to bonding between the radicals. Therefore, the heating member (not shown) may be installed in the waveguide 420 to constantly maintain the temperature of the radicals.

Here, although it is described that the two plasma generators 410 and the two waveguides 420 are provided, when the number of injection ports 140 is two or more, for example, three, three plasma generators 410 and three waveguides 420 may also be provided.

The process gas supplier 430 may supply a gas for forming the thin film to the plasma generator 410 and may supply various process gases such as $O_2$, $N_2$, $H_2$, $N_2O$, $NH_3$, etc. according to the type of the thin film to be manufactured. Here, an example in which $O_2$ is supplied to the plasma generator 410 by the process gas supplier 430 to form an oxide film on the substrate W will be described. The process gas supplier 430 may supply the process gas to the two plasma generators 410. In this case, the process gas supplier 430 may supply the two plasma generators 410 at the same rate or different flow rates of the process gas. Through this, an amount of radicals generated in the two plasma generators 410 may be adjusted to regulate the flow rate of the radicals supplied through the two injection ports 140.

Figure 5:
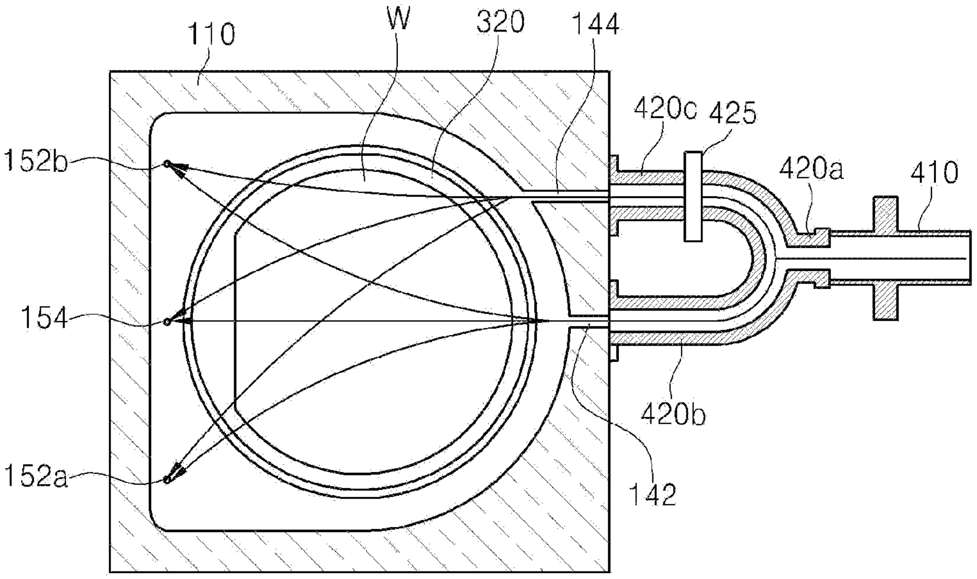
FIG. 5 is a cross-sectional view illustrating an apparatus for forming a thin film according to another embodiment of the present invention.

FIG. 5 is a cross-sectional view illustrating an apparatus for forming a thin film according to another embodiment of the present invention.

Referring to FIG. 5, an apparatus for forming a thin film according to another embodiment of the present invention are almost similar to the apparatus for forming the thin film according to the foregoing embodiment except for a plasma generation part 400.

The plasma generation part 400 may include a plasma generator 410 for generating radicals and a waveguide 420 for connecting the plasma generator 410 to at least two injection ports 140, and the waveguide 420 may include at least two branch tubes 420*b* and 420*c* to connect the plasma generator 410 to the at least two injection ports.

That is, the plasma generation part 400 may generate radicals in one plasma generator 410 and supply the radicals to at least two injection ports 140 through one waveguide 420. Thus, the waveguide 420 may include at least two branch tubes 420*b* and 420*c* to supply the radicals to the at least two injection ports 140. The branch tubes 420*b* and 420*c* may be provided in the same number as the injection ports 140. Here, an example in which the two branch tubes 420*b* and 420*c* are provided in the waveguide 420 to supply the radicals to the two injection ports 140 will be described.

The waveguide 420 may include a connection tube 420*a* connected to the plasma generator 410 and two branch tubes 420*b* and 420*c* connected to the connection tube 420*a* and respectively connected to the two injection ports 140. The waveguide 420 may be provided to have an approximate 'U' shape or 'V' shape.

In addition, a flow regulation member 425 for regulating a flow rate of the radicals may be provided in at least one of the two branch tubes 420*b* and 420*c*. The flow regulation member 425 may include a pendulum valve or the like and may be installed only in one of the two branch tubes 420*b* and 420*c* as illustrated in FIG. 5 or may be installed in all of the two branch tubes 420*b* and 420*c*. Through this, the amount of radicals may be equally adjusted or differently adjusted through the two injection ports 140.

Hereinafter, a method for forming a thin film according to an embodiment of the present invention will be described.

A method for forming a thin film according to an embodiment of the present invention may include a process of loading a substrate W into a chamber 100, a process of heating the substrate W, a process of generating radicals, a process of supplying the radicals to one side of the substrate W through at least two paths, a process of forming a thin film on the substrate W using the radicals, and a process of exhausting residual radicals to the other surface of the substrate W. Here, the process of forming the thin film is described as being performed time-sequentially, but the order may be variously changed. That is, each process may be performed in a different order or at the same time.

The substrate W prepared for forming the thin film may be loaded into the chamber 100 through a gate 130 and then may be seated on an upper portion of a substrate support 320. Here, the substrate W may be a silicon substrate, and the inside of the chamber 100 may be heated to a certain temperature by a heat source part 200.

When the substrate W is seated on the substrate support 320, the gate 130 may be closed to form a vacuum state inside the chamber 100. In addition, the substrate support 320 may rotate, and the substrate W may be heated to a process temperature, for example, a temperature for forming an oxide film, through the heat source part 200.

In addition, oxygen radicals may be generated in a plasma supply part 400, and the generated oxygen radicals may be supplied into the chamber 100 through an injection port 140. Here, the oxygen radicals may be injected and discharged at the same time. Then, the oxygen radicals injected through the injection port 140 may be discharged through the substrate W to an exhaust port 150. The oxygen radicals may be generated in the plasma generator 410 and then supplied to the chamber 100 through the waveguide 420. Here, the waveguide 420 may be heated to prevent the temperature of the oxygen radicals from decreasing in the waveguide 420.

The oxygen radicals may be supplied into the chamber 100 through at least two injection ports 140. The oxygen radicals supplied into the chamber 100 may react with the substrate W while moving from one side to the other side of the substrate W to form a thin film, for example, an oxide film. Here, the oxygen radicals may be supplied through at least two paths parallel to the substrate W so that the oxygen radicals are in sufficient contact with a surface of the substrate W. The at least two paths may refer to positions, at which at least two injection ports 140 are formed, and may include a first path formed at the same height in a direction in which the substrate W extends and including a central portion of the substrate W and a second path including an edge of the substrate W.

The oxygen radicals injected into the chamber 100 through the first path and the second path may be sufficiently diffused throughout a processing space inside the chamber 100 that is formed to be long and wide in horizontal direction. Particularly, since the oxygen radicals are sufficiently diffused from the central portion to one edge of at least the substrate W, a contact area with the substrate W may further increase. Since the substrate W rotates while forming the thin film, the oxygen radicals may be in sufficient contact with the substrate W, so that the thin film, for example, the oxide film is uniformly formed over the entire substrate W.

In the process of supplying the oxygen radicals into the chamber 100, the oxygen radicals may be supplied at the same flow rate into at least two injection ports 140, or the oxygen radicals having different flow rates may be supplied into at least two injection ports 140. For example, more oxygen radicals may be supplied toward the edge of the substrate support 320 rather than toward the central portion of the substrate support 320, and more oxygen radicals may be supplied toward the central portion of the substrate support 320 rather than toward the edge of the substrate support 320.

When the oxide film is formed on the substrate W, the supply of the oxygen radicals may be stopped, and the rotation of the substrate support 320 may be stopped, and then, the substrate W may be unloaded from the chamber 100.

Thereafter, uniformity of the oxide film formed on the substrate W is measured, process conditions may be adjusted in a subsequent process according to the measurement result, and then the thin film may be manufactured. For example, the flow rate of the oxygen radicals supplied through at least two paths may be regulated according to a thickness of the thin film formed on the substrate W, or a position or amount of residual oxygen radicals to be exhausted may be adjusted. Through this, since the thickness of the thin film formed on the substrate W is locally adjusted, the uniformity of the thin film manufactured in the subsequent process may be improved.

Although the present invention has been described with reference to the accompanying drawings and foregoing embodiments, the present invention is not limited thereto and also is limited to the appended claims. Thus, it is obvious to those skilled in the art that the various changes and modifications can be made in the technical spirit of the present invention.

INDUSTRIAL APPLICABILITY

According to the present invention, the thin film may be uniformly formed over the entire substrate by allowing the radicals for forming the thin film to be in uniform contact with the substrate, and the substrate may be suppressed from being deformed by thermal stress to improve process yield and productivity.

What is claimed is:

1. An apparatus for forming a thin film, the apparatus comprising:

a chamber provided in a hollow shape having a width, a thickness, and a height, and configured to define a substrate processing space therein;

a substrate support part connected to the chamber to support a substrate inside the chamber;

a heat source part connected to the chamber to face the substrate support part;

at least two injection ports passing through a sidewall of the chamber in one direction of the width and thickness directions of the chamber;

an exhaust port passing through the sidewall of the chamber at a side facing the at least two injection ports of the one direction; and a plasma generation part connected to the chamber to supply radicals between the substrate support part and the heat source part through the at least two injection ports;

wherein one injection port of the two injection ports is disposed in the one direction toward the center of the substrate to supply the radicals through a first path comprising a central portion of the substrate, and the other injection port is disposed in the one direction toward the edge of the substrate to supply the radicals through a second path comprising the edge of the substrate, wherein the exhaust port comprises first exhaust ports having a spaced distance greater than a diameter of the substrate support part in the other direction of the width and thickness directions of the chamber.

2. The apparatus of claim 1, wherein the processing space is defined to have a height less than each of a width and a thickness thereof.

3. The apparatus of claim 2, wherein the at least two injection ports are disposed at the same height in the height direction of the chamber.

4. The apparatus of claim 2, wherein the at least two injection ports are disposed parallel to each other, or at least one of the at least two injection ports is disposed to be inclined in a horizontal direction.

5. The apparatus of claim 2, wherein the substrate support part comprises a substrate support that is rotatable and installed inside the chamber, and a spaced distance of the injection portions is less than a radius of the substrate support.

6. The apparatus of claim 2, further comprising a guide member disposed inside the chamber to define a passage communicating with each of the at least two injection ports.

7. The apparatus of claim 2, wherein the exhaust port further comprises:

a second exhaust port disposed between the first exhaust ports.

8. The apparatus of claim 2, wherein the plasma generation part comprises:

a plurality of plasma generators configured to generate radicals; and at least two connection tubes configured to connect the plurality of plasma generators to the at least two injection ports, respectively.

9. The apparatus of claim 2, wherein the plasma generation part comprises:

a plasma generator configured to generate radicals;

a connection tube configured to connect the plasma generator to the at least two injection ports; and at least two branch tubes connected to the connection tube and connected to the at least two injection ports, respectively.

10. The apparatus of claim 9, wherein the plasma generation part comprises a flow regulation member installed in at least one of the two branch tubes.

11. The apparatus of claim 9, wherein the plasma generation part comprises a heating member installed on the connection tube or the at least two branch tubes.

12. A method for forming a thin film, the method comprising:

loading a substrate into a chamber and seating the substrate on a substrate support part;

heating the substrate;

generating radicals;

supplying the radicals to one side of the substrate in a direction parallel to the substrate through at least two paths;

allowing the radicals to be in contact with the substrate so as to form a thin film; and exhausting residual radicals to the other side of the substrate, wherein the chamber is provided in a hollow shape having a width, a thickness, and a height, wherein the supplying of the radicals comprises:

supplying the radicals through a first path from one injection port, which is provided toward the center of the substrate, of at least two injection ports passing through a sidewall of the chamber in a width or thickness direction of the chamber, wherein the first path comprises a central portion of the substrate from one side to the other side of the chamber; and supplying the radicals through a second path from the other injection port provided toward an edge of the substrate, wherein the second path comprises the edge of the substrate, wherein the exhausting of the residual radicals comprises exhausting the residual radicals through first exhaust ports of an exhaust port passing through the chamber at a side facing the at least two injection ports, wherein the first exhaust ports have a spaced distance greater than a diameter of the substrate support part.

13. The method of claim 12, wherein the supplying of the radicals comprises supplying the radicals at the same height in a direction in which the substrate extends.

14. The method of claim 12, wherein the supplying of the radicals comprises:

generating the radicals outside the chamber; and transferring the radicals to the chamber, wherein the transferring of the radicals comprises adjusting a temperature of the radicals.

15. The method of claim 12, wherein the supplying of the radicals comprises regulating a flow rate of the radicals supplied to each of at least two paths.

16. The method of claim 12, wherein the exhausting of the residual radicals further comprises:

exhausting the residual radicals through a second exhaust port disposed between the first exhaust ports; and adjusting at least one of a position, at which the residual radicals are exhausted, of the first exhaust ports and the second exhaust port, or an amount of the residual radicals to be exhausted.

* * * * *